United States Patent
Oishi

(10) Patent No.: US 7,315,199 B2
(45) Date of Patent: Jan. 1, 2008

(54) Q VALUE CORRECTION OF FILTER CIRCUIT

(75) Inventor: Kazuaki Oishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/172,891

(22) Filed: Jul. 5, 2005

(65) Prior Publication Data
US 2006/0214726 A1    Sep. 28, 2006

(30) Foreign Application Priority Data
Mar. 23, 2005   (JP)   ............................ 2005-084822

(51) Int. Cl.
*H03K 5/00* (2006.01)
(52) U.S. Cl. .................... 327/553; 327/552
(58) Field of Classification Search ......... 327/552–559
See application file for complete search history.

(56) References Cited

U.S. PATENT DOCUMENTS 5,942,935 A * 8/1999 Okanobu .................... 327/553
6,404,276 B1 * 6/2002 Liu ............................. 327/553
6,512,414 B2 * 1/2003 Yokoyama et al. .......... 327/553

FOREIGN PATENT DOCUMENTS

JP         05-259808        10/1993

* cited by examiner

*Primary Examiner*—Dinh T. Le
(74) *Attorney, Agent, or Firm*—Arent Fox LLP

(57) ABSTRACT

This is a filter circuit for keeping a Q value constant and stabilizing the gain ripple and group delay ripple of a filter by keeping the unity gain frequency of an operational amplifier (op-amp). The filter circuit using an op-amp for keeping the cut-off frequency constant by making a resistance or a capacitance value variable comprises a unity gain angular frequency stabilizing circuit provided with a circuit obtained by copying the input differential stage of the operational amplifier, for connecting a current generating source for generating current under the control of keeping the cut-off frequency constant, for adjusting the output of the copy of the input differential stage and feeding back/inputting the adjusted output to the gate of a transistor, and a circuit for inputting the output of the unity gain angular frequency stabilizing circuit to the gate of the transistor for generating the bias current of the input differential stage of each op-amp.

12 Claims, 7 Drawing Sheets

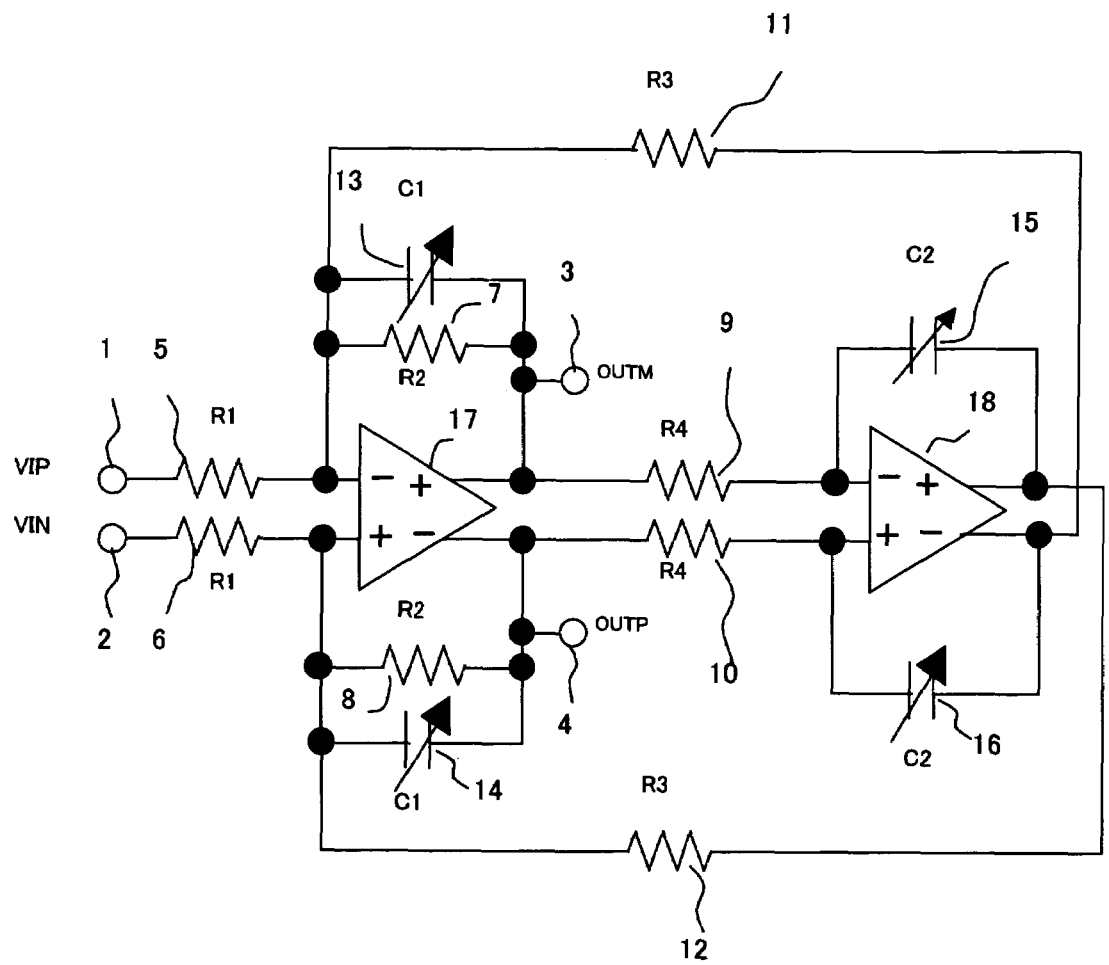
F I G. 1

$$Icnt = \alpha \frac{Vsg}{Rf\ (Code + Coff)} \propto \frac{1}{Rf\ (Code + Coff)}$$

CODE [n:0] IS A DIGITAL CODE   $\alpha$ : PROPORTIONAL CONSTANT DETERMINED BY A TRANSISTOR RATIO

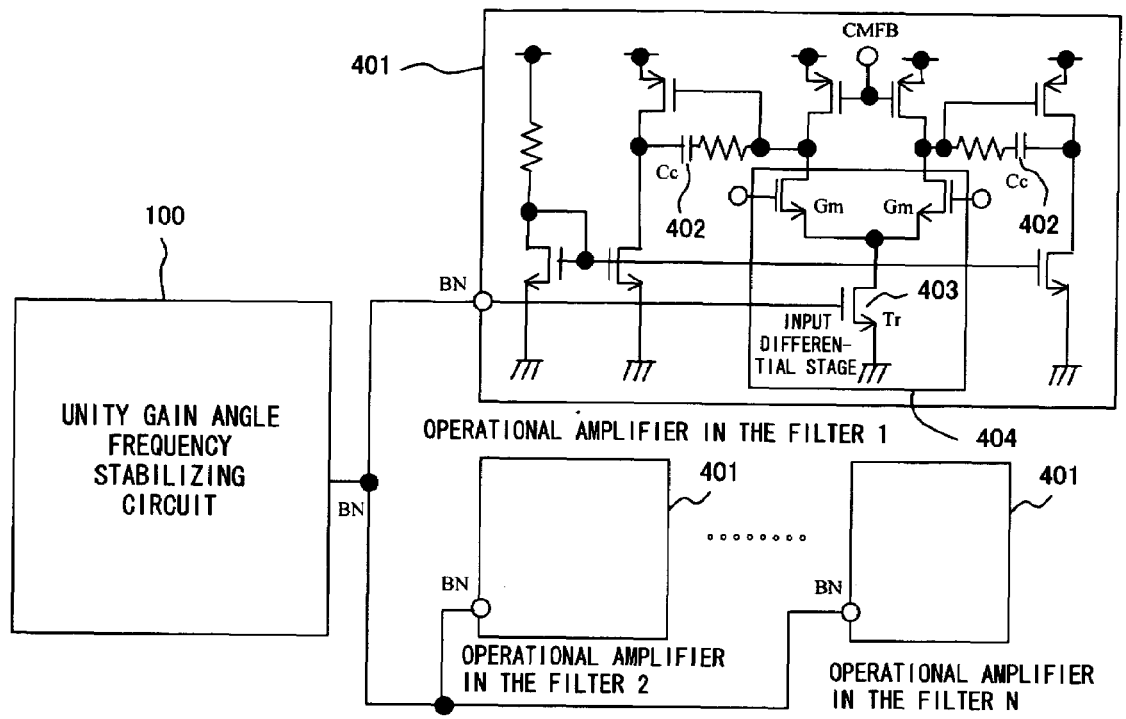
F I G. 6

Q VALUE CORRECTION OF FILTER CIRCUIT

CROSS-REFERENCE TO RELATED APPLICATIONS

This application is based upon and claims the benefit of priority from the prior Japanese Patent Application No. 2005-084822 filed on Mar. 23, 2005, the entire contents of which are incorporated herein by reference.

BACKGROUND OF THE INVENTION

1. Field of the Invention

The present invention relates to a technology for compensating for the variation of the Q value of a filter circuit.

2. Description of the Related Art

Recently, the LSI embedding of an active RC type filter has been promoted. In order to obtain stable characteristics from a filter circuit, a technology disclosed by Patent reference 1 is proposed. For example, in order to obtain a filter characteristic with a steep Q value, a circuit design in which a Q value has a negative temperature characteristic and the gain of a circuit before or after the filter circuit has a negative temperature characteristic is proposed.

Although a filter circuit includes a plurality of methods, the bi-quad filter is widely used.

In FIG. 1, a bi-quad filter (variable-capacitance type) is a two-pole filter.

VIP1 and VIN2 are input terminals to which differential input signals are input. OUTM3 and OUTP4 are output terminals from which differential output signals are output. Reference numerals 5-12 are resistive elements. Reference numerals 17 and 18 are differential operational amplifiers, and reference numerals 13-16 are capacitive elements. A cut-off frequency is adjusted by changing the capacitance value of the capacitive elements.

In the above-mentioned bi-quad filter, a resistive element 5 is connected to its input terminal 1 (VIP), and the other terminal of the resistance 5 is connected to the inverted input (−) of the differential operational amplifier 17. The resistive element 6 is connected to the input terminal 2 (VIN), and the other terminal of the resistive element 6 is connected to the non-inverted input (+) of the differential operational amplifier 17.

The resistive elements 8 and 12, and one terminal of the capacitive element 14 are connected to the non-inverted input (+) of the differential operational amplifier 17, and the other terminal of the resistive element 12 is connected to the non-inverted output (+) of the differential operational amplifier 18, and the resistive element 8 and the other terminal of the capacitive element 14 is connected to the inverted output (−) of the differential output (−) of the differential operational amplifier 17.

One output terminal (+) of the operational amplifier 17 is connected to the output terminal 3 (OUTM), and the other output terminal (−) is connected to the output terminal 4 (OUTP).

One terminal of the resistive element 9 is connected to the non-inverted output (+) of the differential operational amplifier 17, and the other terminal of the resistive element 9 is connected to the inverted input (−) of the differential operational amplifier 18. One end of the resistive elements 10 is connected to the inverted output (−) of the differential operation amplifier 17, and the other terminal of the resistive element 10 is connected to the non-inverted input (+) of the differential operational amplifier 18.

One terminal of the capacitive element 15 is connected to the inverted input (−) of the differential operational amplifier 18, and the other terminal is connected to the non-inverted output (+) of the differential operation amplifier 18. One terminal of the capacitive element 16 is connected to the non-inverted input (+) of the differential operational amplifier 18, and the other terminal is connected to the inverted output (−) of the differential operational amplifier 18.

Equation (1) indicates the general form of the transmission function of a band-pass filter composed of the above-mentioned bi-quad filter.

[Mathematical expression 1]

$$Ts = \frac{K\frac{w1}{Q}s}{s^2 + \frac{w1}{Q}s + w1^2} \quad (1)$$

FIG. 2 shows the frequency characteristic of a band-pass filter described by the transmission function. FIG. 2 shows the ideal frequency characteristic in the case where there are no influences of the DC gain or unity gain angular frequency of the operational amplifier.

In FIG. 2, w1 and BW represent the center angular frequency of a band-pass filter and the frequency bandwidth, respectively. The Q value can be obtained by w1/BW.

In this case, a cut-off frequency (time constant) is inversely proportional to the resistance×capacitance, and fluctuates due to the influences of the resistive element in the LSI, the variation of the capacitive element at the time of manufacturing, temperature change at the time of operation and the like. In order to suppress this fluctuation, a resistance value or a capacitance value is made variable, and it is adjusted in such a way that the cut-off frequency can be kept constant, by an automatic adjustment circuit or manually.

The frequency characteristics of a filter, such as gain ripple, group delay ripple and the like, are affected by the frequency characteristics of the operational amplifier (such as DC gain and unity gain). The frequency characteristics of the operational amplifier (such as DC gain and unity gain) are affected by variation at the time of manufacturing, temperature fluctuation and the like including those inside the LSI. Therefore, the Q value of a filter varies and a filters shape (such as its gain ripple and group delay ripple) varies.

In the case of a bi-quad filter, the relationship between the Q value and the frequency characteristic of an operational amplifier can be approximately expressed by equation (2).

[Mathematical expression 2]

$$Qef = \frac{Q}{1 - 2Q\left(\frac{wc}{wo} - \frac{1}{A0}\right)} \quad (2)$$

Qef: Actual Q value wc: Cut-off angular frequency of a filter

Q: Design value wo: Unity gain angular frequency of an operational amplifier

A0: DC gain of an operational amplifier

According to equation (2), if wo or A0 changes, Qef changes. Therefore, generally, in order to suppress the fluctuation of a Q value, a method for sufficiently increasing the DC gain (A0) and unity gain angular frequency (wo) of an operational amplifier is proposed.

However, generally, although DC gain can be sufficiently increased, unity gain angular frequency (wo) cannot be increased sufficiently. That is because if the unity gain angular frequency (wo) of an operational amplifier is increased in order to suppress the fluctuation of a Q value, the power consumption of a high-speed operational amplifier tends to increase, which is not suitable for low power consumption. Even the high-speed of an operational amplifier is limited, which is a problem. Therefore, it is difficult to manufacture a filter with a small Q value fluctuation, whose gain ripple and group delay ripple are stable, with low power consumption.

Although Patent reference 1 discloses a method for eliminating the temperature fluctuation of a Q value, due to the frequency temperature characteristic of a transistor and eliminating the temperature fluctuation of gain, due to the fluctuation of the Q value, it does not disclose a method for stabilizing gain ripple and group delay ripple.

Patent reference 1: Japanese Patent Application No. H5-259808

SUMMARY OF THE INVENTION

It is an object of the present invention to provide a filter circuit for keeping a Q value constant and stabilizing the gain ripple and group delay ripple of a filter, by keeping the unity gain angular frequency (wo) of an operational amplifier constant so that Gm (the conductance) of the input differential stage of the operational amplifier constituting the filter circuit can be inversely proportional to each controlled device (such as a resistive element, capacitive element, etc.).

According to the present invention, a filter circuit using an operational amplifier which keeps a cut-off frequency constant by making a resistance value or a capacitance value variable comprises a unity gain angular frequency stabilizing circuit provided with a circuit obtained by copying the input differential stage of the operational amplifier, for connecting a voltage source to the input of the copy of the input differential stage and provided with and a current generating source for generating current under the control of keeping the cut-off frequency constant, for connecting the output of the current generating source to the output of the copy of the input differential stage, for adjusting the output of the copy of the input differential stage and feeding back/inputting the adjusted output to the gate of a transistor for generating the bias current of the copy of the input differential stage, and a circuit for inputting the output of the unity gain angular frequency stabilizing circuit to the gate of the transistor for generating the bias current of the input differential stage of each operational amplifier constituting the filter circuit.

When modifying the control keeping the cut-off frequency constant by making the resistance value variable, it is preferable to generate a current in the current generating source which is inversely proportional to the resistance value after making it variable.

With such a configuration, the mutual conductance (Gm) of the copied circuit of the input differential stage of the unity gain angular frequency stabilizing circuit becomes inversely proportional to the controlled resistance value. Furthermore, by inputting the adjusted output to the gate of the transistor for generating the bias current of the input differential stage of the operational amplifier in the filter circuit, the Gm value of the input differential stage of the operational amplifier of the filter circuit becomes inversely proportional to the controlled resistance value and the variation of the Q value can be suppressed. Accordingly, a filter circuit whose gain ripple and group delay ripple are stable can be obtained.

Furthermore, with such a configuration, the scale of a current value can be multiplied by 1/N or N.

According to the present invention, manufacturing variation of each device and the variation due to temperature change or the like, of the Q value of a filter circuit can also be suppressed, and accordingly, a filter circuit whose gain ripple and group delay ripple are stable can be obtained.

BRIEF DESCRIPTION OF THE DRAWINGS

FIG. 1 shows an example of a conventional filter circuit.

FIG. 6 shows an example of the circuit connecting the unity gain angular frequency stabilizing circuit and the filter circuit.

DESCRIPTION OF THE PREFERRED EMBODIMENTS

Figure 2:
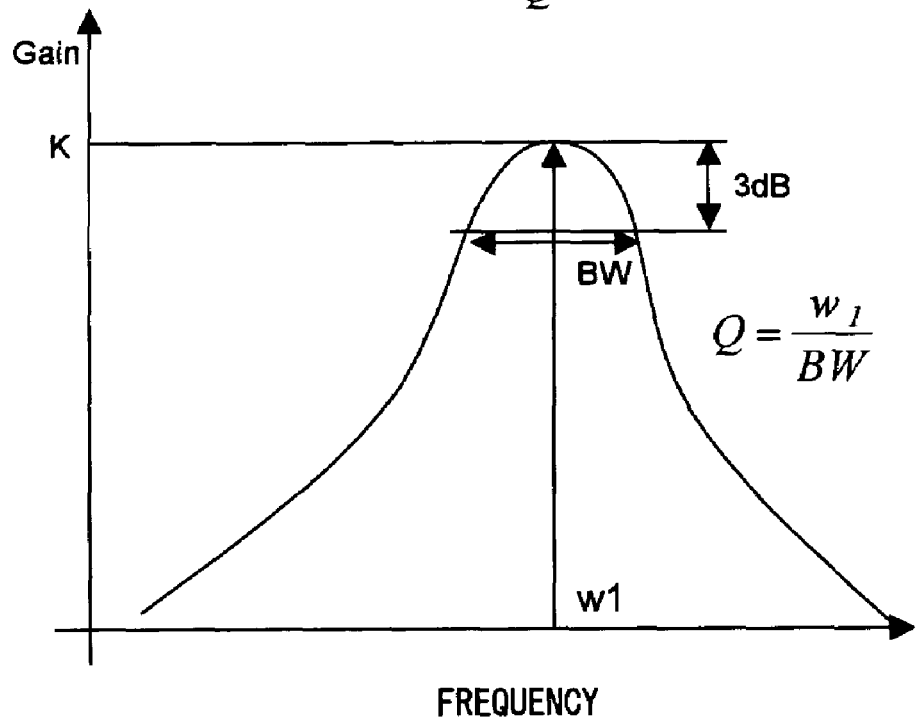
FIG. 2 shows the frequency characteristic of a BPF composed of bi-quad filters.

The preferred embodiments of the present invention, for keeping the unity gain angular frequency (wo) of an operational amplifier for controlling the Gm (conductance) of the input differential stage of the operational amplifier, constant are described in detail below with reference to the drawings.

The First Preferred Embodiment

A filter circuit implemented inside an LSI is configured so that a resistance value or a capacitance value can be changed by a control signal and a cut-off frequency (time constant) can be kept constant.

In the case of an active RC filter, the cut-off frequency can be kept constant, for example, by making the resistance value of a resistive element or the capacitance value of a capacitive element variable according to a control signal.

In case that the cut-off frequency is kept constant, a plurality of resistive elements are disposed in order to make their resistance value variable, and by enabling the connection between the resistive elements to be switched based on a control signal (correction code (Code)), an appropriate resistance value can be selected. Code is calculated when setting a cut-off frequency.

In equation (3) the resistance value is variable and modifies the cut-off frequency. The resistive elements are connected in such a way as to be switched, and are controlled in such a way that the connection form of the resistive elements can be switched by a control signal (Code). Namely, the increase/decrease of the resistance value is controlled.

For example, the resistance value of each resistive element can also be assigned in the width of 1 bit using the control signal (Code) and the offset value (Coff) of the correction code, which are digital signals. Furthermore, their connections are modified in such a way that the resistance value of each resistive element may become a resistance value indicated by each digital code (in the case of the resistance connection switching, a resistance switching digital code) in advance, using the Code of 3-bit, for example, in such a way that if it is "000" or "001", the resistance value may become A or B ohms, respectively. Coff is an offset value for making a resistance value variable, and can also be reflected in Code in advance.

[Mathematical expression 3]

$$\text{Cut-off frequency} \propto \frac{1}{\Delta R(\text{Code} + \text{Coff}) \times C} = \text{constant} \quad (3)$$

In this case, the connection can be in series or parallel. Alternatively, a series connection and a parallel connection can be mixed. Therefore, it can be possible if a function that can be indicated by $\Delta R(\text{Code}+\text{Coff}) \times C$ to modify the resistance value by a resistance switching digital code, as shown by equation (3) can be realized.

If the capacitance value is made variable, the resistance value of a resistive element is fixed and the capacitance value of a capacitive element is made variable. If a capacitance value is made variable, a plurality of capacitive elements are disposed in order to make their capacitance values variable, and by enabling the connection between the capacitive elements, based on a control signal (correction signal (Code)) an appropriate capacitance value can be selected.

In equation (4) the capacitance value is variable and modifies the cut-off frequency. The capacitive elements are connected in such a way as to be switched, and the number of the capacitive elements to be connected by the control signal (Code) is controlled. Namely, the increase/decrease of the capacitance value is controlled.

In equation (4), as in equation (3), the capacitance value of each capacitive element can also be assigned in the width of 1 bit, using the control signal (Code) and the offset value (Coff) of the correction code, which are digital signals. Furthermore, their connections are modified in such a way that the capacitance value of each capacitive element may assume a capacitance value indicated by each digital code (in the case of the capacitance connection switching, a capacitance switching digital code) in advance, using the Code of 3-bit, for example, in such a way that if it is "000" or "001", the capacitance value may assume A or B farads, respectively. Coff is an offset value for making a capacitance value variable, and can also be reflected in Code in advance.

[Mathematical expression 4]

$$\text{Cut-off frequency} \propto \frac{1}{R \times \Delta C(\text{Code} + \text{Coff})} = \text{constant} \quad (4)$$

In this case, the connection can be in series or parallel. Alternatively, a series connection and a parallel connection can be mixed. Therefore, it can be possible if a function that can be indicated by $R \times \Delta C(\text{Code}+\text{Coff})$ to modify the capacitance value by a capacitance switching digital code, as shown by equation (4) can be realized.

Figure 3:
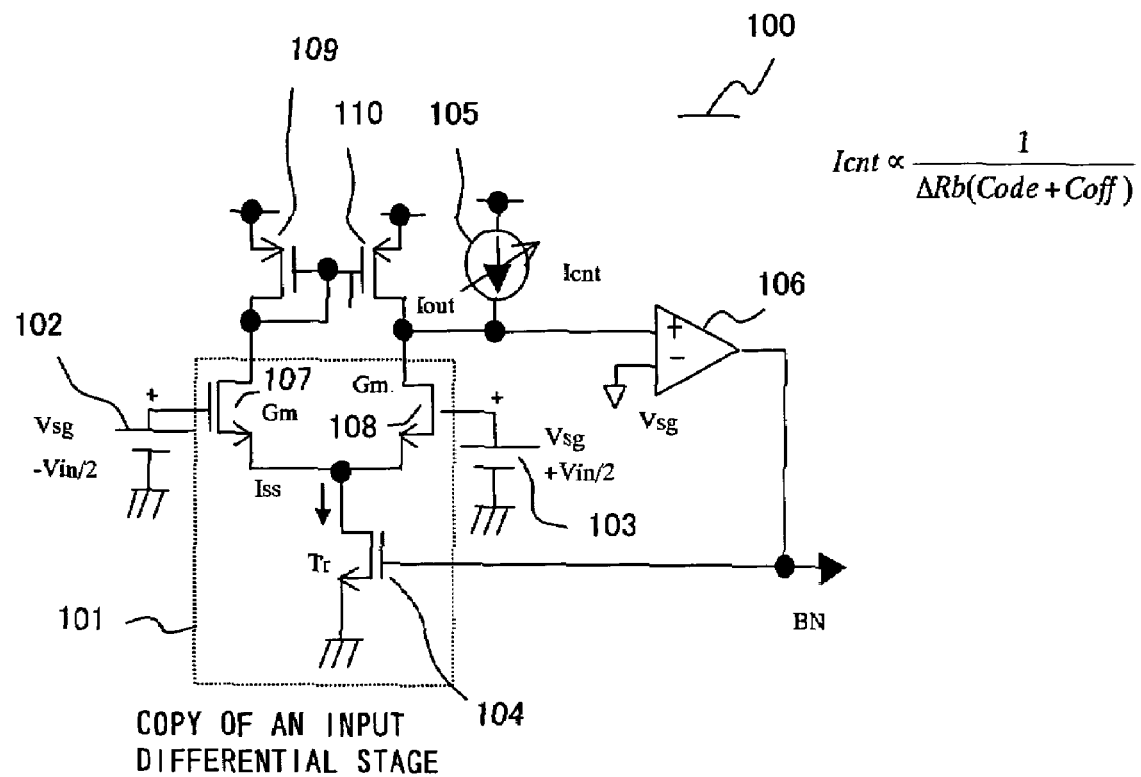
FIG. 3 is the circuit diagram of the unity gain angular frequency stabilizing circuit of the present invention.

FIG. 3 shows a circuit for making the Gm value of the input differential stage inversely proportional to the controlled variable resistance value (unity gain angular frequency stabilizing circuit). The unity gain angular frequency stabilizing circuit comprises an input differential stage 101, input voltages 102 and 103, a variable current generating circuit (current generating source) 105, a differential amplifier 106 (it is not limited to a differential amplifier and an operational amplifier, and can also be a circuit capable of amplifying, attenuating or adjusting) and the like. The input differential stage 101 can be obtained by copying the input differential stage of the operational amplifier constituting the filter circuit.

The input differential stage 101 comprises transistors 107, 108 and 104. The source of each of the transistors 107 and 108 is connected to the drain of the transistor 104. The gate of the transistor 107 is connected to the plus side of a voltage source Vsg 102 (−Vin/2), and the minus side of the voltage source 102 is connected to the ground. The gate of the transistor 108 is connected to the plus side of a voltage source Vsg 103 (+Vin/2), and the minus side of the voltage source 103 is connected to the ground. The source of the transistor 104 is also connected to the ground.

The source of each of transistors 109 and 110 is connected to the power supply, and the gate of transistor 109 is connected to the gate of the transistor 110 and the drain of the transistor 107. The drain of the transistor 110 is connected to the output of the variable current generating circuit 105 together with the drain of the transistor 108, and is connected to the non-inverted input (+) of the differential amplifier 106. The input of the variable current generating circuit 105 is connected to the power supply.

The inverted input (−) of the differential amplifier is connected to Vsg, and its output is fed back and connected to the gate of the transistor 104.

The output current Iout of the input differential stage 101 shown in FIG. 3 can be approximated by the following equation (5) if a voltage Vin input to the input differential stage 101 is small.

[Mathematical Expression 5]

$$I_{out} = Gm \times V_{in} \quad (5)$$

Iout: Output current
Vin: Input voltage
Gm: Mutual conductance of input differential stage Since the Gm value in FIG. 3 has the relationship indicated by the following equation (6) with current flowing through the input differential stage 101, the Gm value of the transistors 107 and 108 of the input differential stage 101 also varies if the gate voltage of the transistor 104 for generating the bias current of the input differential stage 101 is changed. Iss is the current flowing through the transistor 104, the current Iss flowing through the transistor 104 also varies if the gate voltage of the transistor 104 is changed. As a result, the Gm of the input differential stage 101 also varies.

[Mathematical expression 6]

$$Gm = \frac{\partial I_{out}}{\partial V_{in}} = \frac{1}{2}\beta \frac{\frac{4Iss}{\beta} - 2V_{in}^2}{\sqrt{\frac{4Iss}{\beta} - V_{in}^2}} \approx \sqrt{\beta Iss} \quad (6)$$

$$\beta = \frac{\mu C_{ox} W}{L}$$

Iss: Current flowing through transistor 104
β: Physical constant of transistor 104

μ: Degree of carrier movement of transistor 104

$C_{ox}$: Gate oxide film capacitance of transistor 104

W: Channel width of transistor 104

L: Channel length of transistor 104

Then, a specific voltage Vin (Vsg 102, 103: +Vin/2, −Vin/2) is applied to the input (gate of each of transistors 107 and 108) of the input differential stage 101. A current value generated by the output $I_{cnt}$ of the variable current generating circuit 105 is input to the output current $I_{out}$ of the input differential stage 101. In this case, if Icnt∝1/ΔRb (Code+Coff) is input and the feedback shown in FIG. 3 is achieved, the Gm value of the input differential stage 101 can be expressed as follows.

[Mathematical expression 7]

$$Gm = \frac{Icnt}{Vin} \propto \frac{1}{\Delta Rb(Code + Coff)} \quad (7)$$

Figure 4:
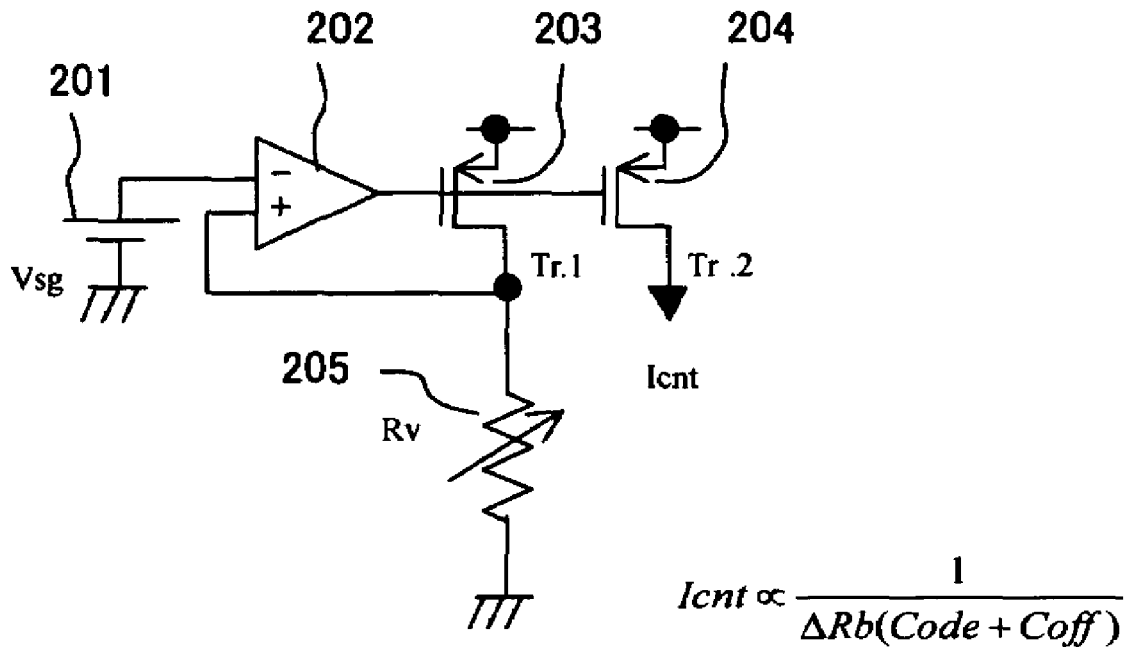
FIG. 4 shows an example of the variable current generating circuit of the present invention.

FIG. 4 shows an example of the variable current generating circuit 105. The variable current generating circuit generates current inversely proportional to the variable resistance value controlled by a resistance switching digital code. The minus side of a voltage source Vsg 201 is connected to the ground, and its plus side is input to the inverted input (−) of a differential amplifier 202. It's non-inverted input (+) is connected to the drain of a transistor 203 and is connected to one terminal of a variable resistor 205. The other terminal is connected to the ground.

The output of the differential amplifier 202 is connected to the gate of each of the transistors 203 and 204. The source of each of the transistors 203 and 204 is connected to the power supply. It is assumed that the drain of the transistor 204 is output (Icut).

In this case, in the variable resistor 205, a plurality of resistive elements are disposed and are switched by a resistance switching digital code, which is composed of the correction code (Code) of a cut-off frequency and the offset value (Coff) of the correction code to make the resistance value of the variable resistor 205 variable. For example, the resistance value of the variable resistor 205 can be made variable by changing its connection form by the correction code of the cut-off frequency and the offset value of the correction code using ΔRb as the 1-bit interval of the variable resistor.

For example, the resistance value is made modifiable by a resistance switching digital code as in a resistance value Rv=ΔRb(Code+Coff). With such a configuration, current can be controlled (a current value Icnt∝1/ΔRb (Code+Coff)).

Figure 5:
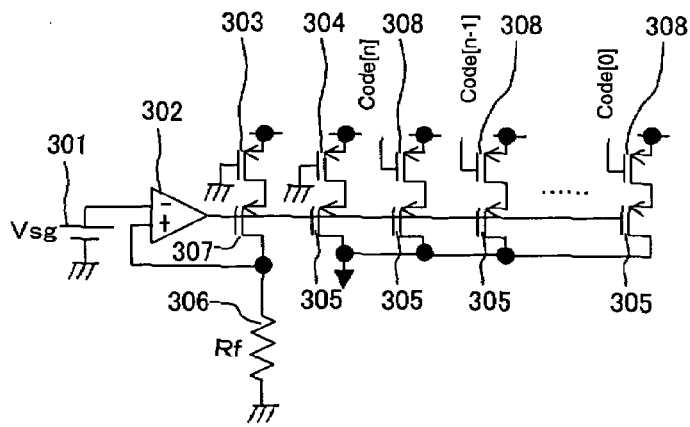
FIG. 5 shows another example of the variable current generating circuit of the present invention.

Alternatively, the variable current generating circuit shown in FIG. 5 can be used. In such a case, the minus side of a voltage source Vsg 301 is connected to the ground, and its plus side is connected to the inverted input (−) of a differential amplifier 302. Its non-inverted input (+) is connected one terminal of a fixed resistor (Rf) 306 and the drain of a transistor 307. The other terminal is connected to the ground.

The output of the differential amplifier 302 is connected to the gate of each of the transistors 307 and 305. The drain of the transistor 303 and the source of the transistor 307 are connected, and the gate of the transistor 303 is connected to the ground.

The drain of the transistor 304 and the source of each transistor 305 are connected, and the gate of the transistor 304 is connected to the ground.

The source of each transistor 305 is connected to the drain of each corresponding transistor 308. The correction code and its offset value are applied to the gate of each transistor 308 to control the gate.

In this case, the correction code and its offset value are digital signals (current control digital code) In FIG. 5, the bus width is determined to be (n+1) bits as Code[n:0], and current corresponding to the correction code can be generated in advance. This output current Icnt is expressed as αVsg/(Rf(Code+Coff))∝1/(Rf(Code+Coff)). In this expression, α and Rf(Code+Coff) are a proportional constant and the resistance value of the fixed resistor in the case where its current is controlled, respectively. The offset value can be incorporated into the correction code. Although in the above description, the variable current generating circuit is active-LOW, it is not limited to this implementation.

FIG. 6 shows an example of the configuration in which the Q value of the filter is stabilized by the unity gain angular frequency stabilizing circuit. It is obtained by connecting the BN of the above-mentioned unity gain angular frequency stabilizing circuit 100 and the BN of operational amplifiers 1-N (integer) in the filter circuit.

If the BN output of the unity gain angular frequency stabilizing circuit 100 is input to the gate of a transistor 403 for generating bias current, of the input differential stage of each operational amplifier 401 implemented inside the filter circuit, the unity gain angular frequency of the operational amplifier 401 in the filter circuit becomes constant according to equation (8).

The unity gain angular frequency of the operational amplifier 401 can be expressed as wo=Gm/Cc (Cc 402: phase compensation capacitance of an operational amplifier). The cut-off frequency is adjusted in such a way as to be constant, by the correction code (Code) and its offset value (Coff), according to equation (3) or (4). All the resistance of a plurality of resistive elements in the LSI change at the same rate. All the capacitance of a plurality of capacitance elements in the LSI change at the same rate.

In this case, since the relationship between ΔRb and Cc is equivalent to the relationship between ΔR and C. In the case, since equation (3) is constant, ΔRb(Code+Coff)×Cc becomes constant.

According to equation (4), since the relationship between ΔRb and Cc is proportional to the relationship between R and ΔC, ΔRb(Code+Coff)×Cc becomes constant.

Accordingly, as shown in equation (8), the unity gain angular frequency wo of the operational amplifier 401 can be adjusted to be constant.

[Mathematical expression 8]

$$wo = \frac{Gm}{Cc} \propto \frac{1}{\Delta Rb(Code + Coff) \times Cc} = \text{constant} \quad (8)$$

As described above, by keeping the unity gain angular frequency wo of the operational amplifier 401 constant, as shown in equation (2), wo and wc can be stabilized and the Q value can be kept constant, thereby stabilizing the gain ripple and group delay ripple of a filter.

Figure 7:
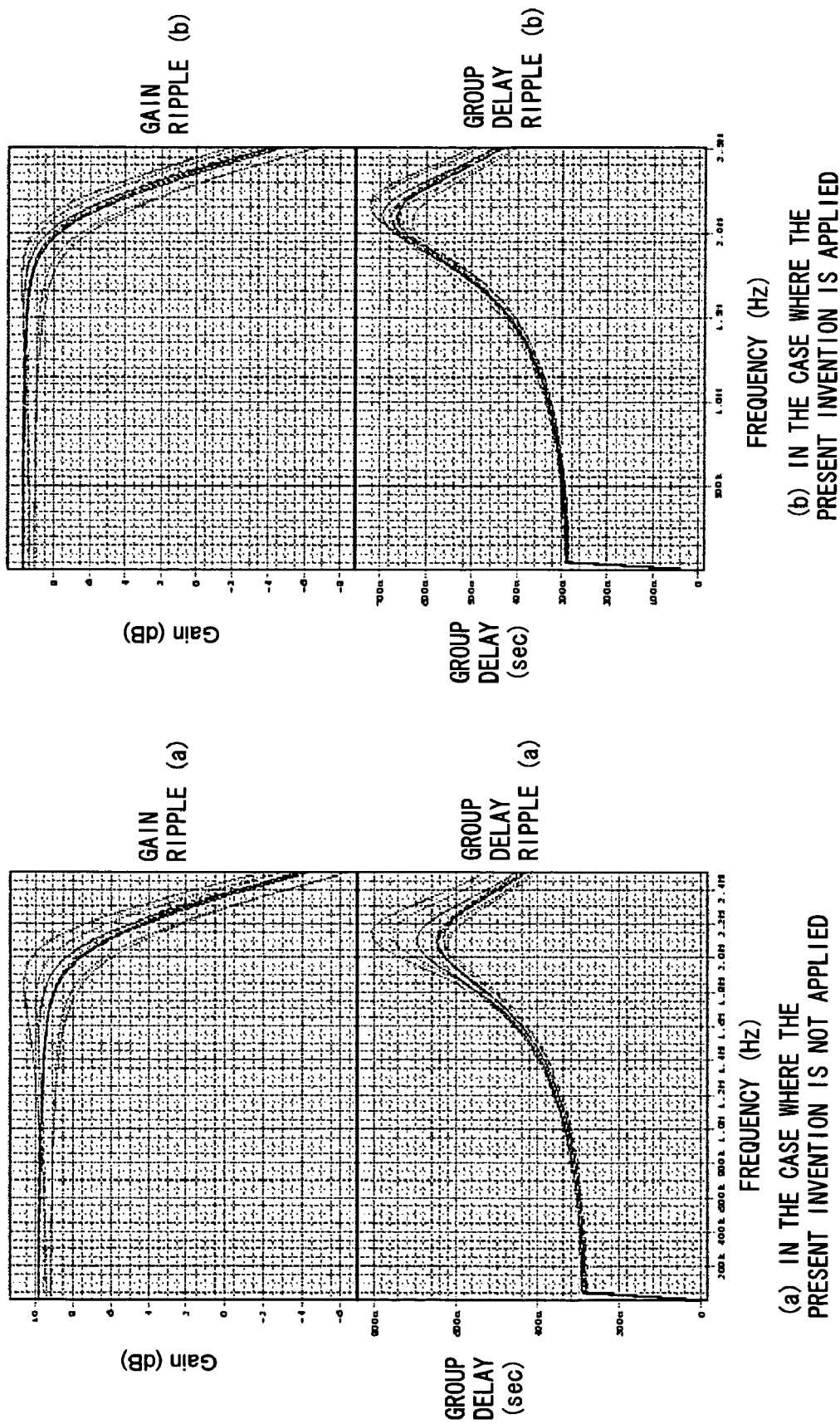
FIG. 7 shows the simulation results of an LPF frequency characteristic.

FIG. 7 shows the simulation results of stabilizing the Q value of a bi-quad filter by the unity gain angular frequency stabilizing circuit 100. The graph of this simulation is the result of variation corner conditions obtained by combining temperature fluctuation/supply voltage fluctuation/manufacturing variation. FIG. 7 shows the frequency characteristics of a low-pass filter. FIG. 7A shows the frequency-gain characteristic and the frequency-group delay characteristic in the case where the unity gain angular frequency stabilizing circuit is not used. FIG. 7B shows the frequency-gain characteristic and the frequency-group delay characteristic in the case where the unity gain angular frequency stabilizing circuit is used.

When comparing gain ripple (a) with gain ripple (b), it is found that in the gain ripple (b), the fluctuation of gain ripple is suppressed. As for the group delay ripple, the fluctuation of group delay ripple (b) is better suppressed than that of group delay ripple (a).

When configuring the unity gain angular frequency stabilizing circuit, the number of parallel connections of transistors constituting the input differential stage 101 can also be multiplied by 1/N or N. In this case, N is an integer. Although in this preferred embodiment, the copy of an operational amplifier constituting the filter circuit is used for the unity gain angular frequency stabilizing circuit, another input differential stage with a different number of parallel connections of transistors can also be used as long as their configurations are the same.

The present invention is not limited to the above-mentioned preferred embodiment, and its variations and modifications are also possible as long as the subject matter of the present invention is not deviated from.

What is claimed is:

1. A filter circuit utilizing an operational amplifier for keeping a cut-off frequency constant by varying a resistance value or a capacitance value, comprising:
   a unity gain angular frequency stabilizing circuit including:
      a circuit obtained by replicating an input differential stage of the operational amplifier having an input connected to a voltage source and having an output;
      a current generating source for generating a current based on an operation keeping the cut-off frequency constant and having an output connected to the output of the circuit obtained by replicating an input differential stage of the operational amplifier, for adjusting the output of the circuit obtained by replicating an input differential stage of the operational amplifier;
      a transistor having a gate connected to the adjusted output of the current generating source for generating a bias current of the circuit obtained by replicating an input differential stage of the operational amplifier; and
      a circuit for inputting an output of the unity gain angular frequency stabilizing circuit to the gate of the transistor for generating the bias current of the input differential stage of each operational amplifier constituting the filter circuit.

2. The filter circuit according to claim 1, wherein the resistance value is varied according to a control signal based on the operation, and the circuit obtained by replicating an input differential stage of the operational amplifier outputs a current that is inversely proportional to the resistance value after being varied in the current generating source.

3. The filter circuit according to claim 2, further comprising a variable resistor including a plurality of fixed resistive elements, wherein the inversely proportional current is adjusted by modifying the resistance value of the variable resistor by switching a connection between the fixed resistive elements disposed in the variable resistor based on the control signal.

4. The filter circuit according to claim 3, wherein
   the connection between the fixed resistive elements is switched to one corresponding to a resistance switching digital code generated under the said control signal.

5. The filter circuit according to claim 4, wherein
   the resistance switching digital code includes an offset value for adjusting an offset of the current generating source.

6. The filter circuit according to claim 2, further comprising a plurality of current sources, wherein the inversely proportional current is adjusted by switching the current output on/off for each of the current sources based on the control signal.

7. The filter circuit according to claim 6, wherein
   the switching on/off of a current output of the current source is achieved by the switching on/off of the current source corresponding to a current control digital code generated under said control signal.

8. The filter circuit according to claim 7, wherein
   the current control digital code includes an offset value for adjusting an offset of the current generating source.

9. The filter circuit according to claim 1, wherein
   the output of the circuit obtained by replicating an input differential stage of the operational amplifier is adjusted by amplifying the output.

10. The filter circuit according to claim 1, wherein
    the operational amplifier includes a number of transistors connected in parallel,
    the circuit obtained by replicating an input differential stage of the operational amplifier comprises a number of transistors connected in parallel, and
    the number of transistors connected in parallel comprising the replicated input differential stage of the operational amplifier is obtained by multiplying the number of transistors connected in parallel in the operational amplifier by 1/N or N, where N is an integer.

11. The filter circuit according to claim 1, wherein
    the current generating source includes:
    an operational amplifier having an inverted input terminal connected to a voltage source, a non-inverted input terminal, and an output;
    a variable resistive element having a first terminal connected to the non-inverted input terminal of the operational amplifier and a second terminal connected to ground;
    a first transistor having a drain connected to the non-inverted input terminal of the operational amplifier, a gate connected to the output of the operational amplifier and a source connected to a power supply; and
    a second transistor having a source connected to the power supply, a gate connected to the output of the operational amplifier and a drain used as an output terminal of the current generating source.

12. The filter circuit according to claim 1, wherein the operational amplifier includes a phase compensation capacitive element having a capacitance value proportional to a capacitance value necessary for keeping the cut-off frequency constant.

* * * * *